(12) United States Patent
Sera

(10) Patent No.: US 6,287,898 B1
(45) Date of Patent: Sep. 11, 2001

(54) THIN FILM TRANSISTOR MANUFACTURING METHOD

(75) Inventor: Kenji Sera, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/325,161

(22) Filed: Jun. 3, 1999

(30) Foreign Application Priority Data

Jun. 5, 1998 (JP) .................................................. 10-174111

(51) Int. Cl.⁷ ............................. H01L 21/00; H01L 21/20
(52) U.S. Cl. ......................... 438/149; 438/151; 438/154; 438/164; 438/166
(58) Field of Search .................................. 438/149, 151, 438/307, 164, 166, 154

(56) References Cited

U.S. PATENT DOCUMENTS

| | | | |
|---|---|---|---|
| 5,439,837 | * 8/1995 | Hata et al. | 437/41 |
| 5,580,800 | * 12/1996 | Zhang et al. | 437/40 |
| 5,953,598 | * 9/1999 | Hata et al. | 438/164 |
| 6,077,730 | * 6/2000 | Lee et al. | 438/149 |

OTHER PUBLICATIONS

Patent Abstract of Japan with English language translation, Deguchi Tsukasa, Thin Film Transistor and Manufacturing Method Thereof, Publication No.: 09289318, Date of Publication: Nov. 4, 1997.

Patent Abstract of Japan with English language translation, Takahashi Mutsuya et al., Manufacture of Thin Film Transistor, Publication No.: 08279620, Date of Publication: Oct. 22, 1996.

Patent Abstract of Japan with English language translation, Kobayashi Kazuhiro et al., Thin Film Transistor and Its Manufacture, Publication No.: 06333948, Date of Publication: Dec. 2, 1994.

\* cited by examiner

*Primary Examiner*—Michael Lebentritt
(74) *Attorney, Agent, or Firm*—McGuireWoods LLP

(57) ABSTRACT

After a polycrystalline silicon film is formed on a glass substrate, the first gate insulating film is formed on the polycrystalline silicon film and the polycrystalline silicon film and the first gate insulating film are patterned into a island shape. Next, impurities are doped into the polycrystalline silicon film through the first gate insulating film using a resist mask, thereby forming the first source-drain region in part of the polycrystalline silicon film. Further, the second gate insulating film is formed on the first gate insulating film and a gate electrode is formed on the second gate insulating film. Thereafter, impurities are lightly doped through the first and second gate insulating films to thereby form the second source-drain region. Thus, no high etching technique is required for the manufacture of a thin film transistor and occurrence of electrostatic damage to the gate insulating films is prevented, to thereby make it possible to improve production yield.

19 Claims, 6 Drawing Sheets

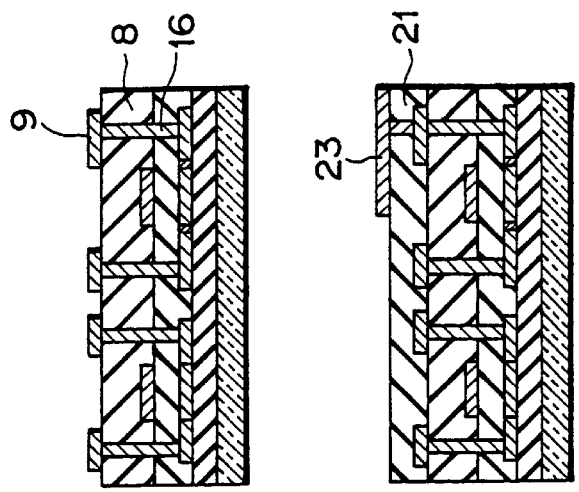
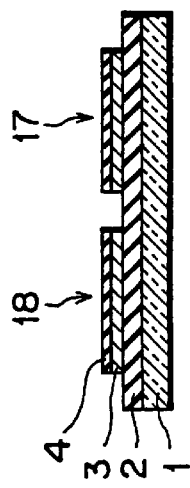
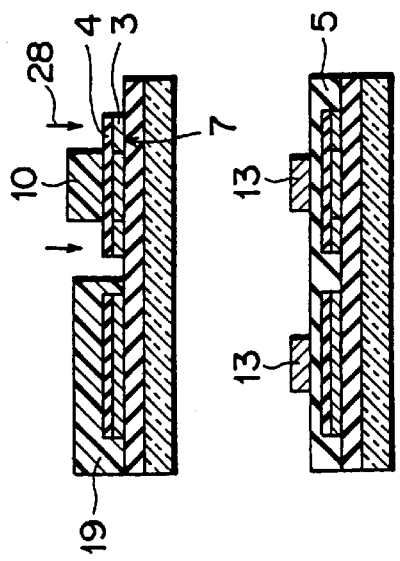
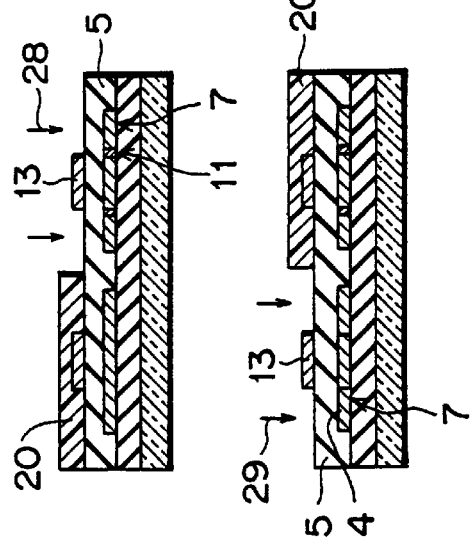
FIG.6A FIG.6B FIG.6C FIG.6D FIG.6E FIG.6F FIG.6G

THIN FILM TRANSISTOR MANUFACTURING METHOD

BACKGROUND OF THE INVENTION

1. Field of the Invention

The present invention relates to a method of manufacturing a thin film transistor used in a liquid crystal display device.

2. Description of the Related Art

In recent years, active research and engineering development have been underway for applying a thin film active device formed on a glass substrate to various fields such as a large area transmission liquid crystal display and an adhesion type image sensor. In particular, a low-temperature polycrystalline silicon thin film transistor (TFT) has attracted attention as a most desirable device for realizing an integrated thin film device incorporating peripheral drive circuits.

FIGS. 1A through 1D are cross-sectional views showing a method of fabricating such a thin film transistor as a self-aligned planar thin film transistor in the order of steps. In this method, as shown in FIG. 1A, a polycrystalline silicon film 14 is formed on a glass substrate 6 through a silicon oxide film 12.

Next, as shown in FIG. 1B, a gate insulating film 24 of a silicon oxide film is formed on the polycrystalline silicon film 14 so as to cover the polycrystalline silicon film 14. After a film of a material for an gate electrode is formed on the gate insulating film 24, the gate electrode film is etched together with the gate insulating film 24 provided under the gate electrode film, thereby forming a gate electrode 26.

Thereafter, as shown in FIG. 1C, the polycrystalline silicon film 14 is doped with impurities 28 using the gate electrode 26 as a mask and a source-drain region 30 is formed in a self aligned manner.

Further, as shown in FIG. 1D, a gate insulating film 24 is formed again on a whole surface of the device, an interlayer insulating film 32 is formed on the gate insulating film 24 and an electrode 36 is formed on the interlayer insulating film 32. The electrode 36 is connected to the source-drain region 30 through a contact hole 34 formed in the interlayer insulating film 32 and the gate insulating film 24. By doing so, a thin film transistor is completed.

In the above-stated conventional manufacturing method, however, if the gate electrode material as well as the gate insulating film 24 is etched, it is quite difficult to selectively etch the gate insulating film 24 since it is an oxide film of the polycrystalline silicon film 14. As a result, production yield is sometimes disadvantageously decreased.

The improved conventional technique to overcome the disadvantage is shown in FIGS. 2A to 2D. In FIGS. 2A to 2D, same reference numerals denote the same elements as those in FIGS. 1A to 1D and no detailed description is given thereto. As shown in FIG. 2B, a gate insulating film 24 is formed on the entire surface and then a gate electrode 26 is formed into a predetermined pattern.

Next, as shown in FIG. 2C, using the gate electrode 26 as a mask, impurities 28 are implanted into a polycrystalline silicon film 14 through the gate insulating film 24. Thereafter, as shown in FIG. 2D, an interlayer insulating film 32 and then an electrode 36 are formed.

Since this method does not require etching the gate insulating film 24, the above disadvantage related to etching process can be avoided.

However, the thickness of the gate insulating film 24 is normally about 1000 Å. To implant impurities 28 into a semiconductor layer through the oxide film having such a thickness and provided on the semiconductor layer, it is necessary to accelerate the impurities 28 at a voltage of 100 keV or higher, so that a quite expensive impurity doping system is needed and investment cost is increased accordingly As a result, production cost is disadvantageously increased. Besides, when the impurities 28 are implanted at such high voltage, electrostatic damage easily occurs to the gate insulating film 24, thus deteriorating yield.

Meanwhile, we note that the following are already published as methods of manufacturing a thin film transistor. First, in the method described in Japanese Unexamined Patent Publication No. 6-333948, a gate insulating film is formed to include a stepped portion in a position wider than a gate electrode to thereby have different film thickness. Ion implantation is performed using the gate electrode and gate insulating film as masks. Thus, an LDD structural TET including an LDD region and a source-drain region can be obtained.

Japanese Unexamined Patent Publication No. 8-279620 discloses a thin film transistor manufacturing method in which an active region consisting of a polycrystalline silicon thin film, a source-drain region consisting of a low resistance region, a high resistance region for connecting the active region and the source-drain region are formed on an insulating substrate. In this method, the high resistance region is formed by implanting ions of non-mass separation type while cooling the substrate. Thus, the high resistance region can be formed under doping conditions of high accelerating voltage and high dosage.

Further, Japanese Unexamined Patent Publication No. 9-289318 discloses that a high resistance part having lower crystallinity than that of a channel region is formed on at least part of a drain region and a source region.

The thin film transistor manufacturing methods described in the above-cit-ed references, however, do not overcome the above-stated disadvantage.

SUMMARY OF THE INVENTION

It is an object of the present invention to provide a thin film transistor manufacturing method which can dispense with an etching step requiring high technique, which can prevent electrostatic damage to a gate insulating film and which can increase production yield.

The present invention is a method of manufacturing a thin film transistor including a thin film semiconductor layer on an insulating substrate, a source-drain region within the thin film semiconductor layer, a gate electrode above the region between the source region and drain region and an electrode connected to the source-drain region. The method according to this present invention is characterized by comprising the steps of: after forming the thin film semiconductor layer on the insulating substrate, forming a first gate insulating film on the thin film semiconductor layer to cover the thin film semiconductor layer; patterning the thin film semiconductor layer and the first gate insulating film into an island shape, doping impurities into the thin film semiconductor layer through first gate insulating film excluding a region including at least main parts of the gate electrode inside to form a first source-drain region in part of the thin film semiconductor layer; forming a second gate insulating film on the first gate insulating film to cover the first gate insulating film; forming the gate electrode on the second gate insulating film; and while using the gate electrode as a mask, doping the impurities relatively lightly through the first and second insulating films and thereby forming a second source-drain region in the thin film semiconductor layer. The second source-drain region has a lower concentration of the impurity than that of the first source-drain region.

Hence, according to this present invention, it is enough for the first and second gate insulating films to have a necessary thickness for the gate insulating film as a whole, and the first insulating film may be formed thinly. Therefore, when the impurities are doped through the first gate insulating film, necessary impurity concentration can be obtained without implanting the impurities at high speed. Also, in case of the second doping conducted through the first and second gate insulating films, the impurities are doped at lower concentration than in case of the first doping. In this second doping case, too, there is no need to implant the impurities at high speed. Static damage does not occur to the first and second gate insulating films.

Before the second doping, the gate electrode is formed by etching process. Since the second gate insulating film can be formed of a semiconductor oxide film and the gate electrode can be formed of doped polycrystalline silicon or silicide, the gate electrode of doped polycrystalline silicon or silicide formed on the semiconductor oxide film is etched relatively easily. Thus, etching can be always performed in a stable manner and there is no fear of the reduction of production yield resulting from this etching process.

In addition, the present invention is a method of manufacturing a thin film transistors having an N-type thin film transistor and at P-type thin film transistor on a same insulating substrate, each of the N-type thin film transistor and the P-type thin film transistor including a thin film semiconductor layer on the insulating substrate, a source-drain region in the thin film semiconductor layer, a gate electrode above the source-drain region and an electrode connected to the source-drain region. The method according to the present invention is characterized by comprising the steps of: after forming the thin film semiconductor layer on the insulating substrate, forming a first gate insulating film on the thin film semiconductor layer to cover the thin film semiconductor layer; patterning the thin film semiconductor layer and the first gate insulating film into a island shape and forming at least first and second transistor regions; doping N-type impurities into the thin film semiconductor layer excluding a region including at least main parts of the gate electrode in the first transistor region and forming a first source-drain region in part of the thin film semiconductor layer; forming a second gate insulating film on the first gate insulating film to cover the first gate insulating film; forming the gate electrode on the second gate insulating film in each of the first and second transistor regions; forming a second N-type source-drain region in the thin film semiconductor layer in the first transistor regions by doping the N-type impurities relatively lightly through the first and second gate insulating films using the gate electrode as a mask; and forming a P-type source-drain region in the thin film semiconductor layer in the second transistor region by doping P-type impurities through the first and second gate insulating films using the gate electrode as a mask.

Hence, as for the N-type transistor, the present invention can attain the same object as that in the above invention. On the other hand, as for the P-type transistor, P-type impurities are doped through the first and second gate insulating films using the gate electrode as a mask and the P-type source-drain region is formed in the thin film semiconductor layer. In this case, too, the insulating layer is not etched unlike the conventional method. Thus, the problem relating to etching process does not occur and a thin film transistor can be manufactured with less steps.

Furthermore, by using P-type impurities such as boron which have a small mass, the impurities of necessary concentration can be doped without implanting them at high speed in case of doping conducted through the first and second gate insulating films. Owing to this, there is no need to accelerate impurities by applying high voltage and no electrostatic damage occurs to the first and second gate insulating films.

BRIEF DESCRIPTION OF THE DRAWING

FIGS. 6A through 6G are cross-sectional views showing a thin film transistor manufacturing method in the fourth embodiment according to the present invention in the order of steps.

DESCRIPTION OF THE PREFERRED EMBODIMENTS

Now, the preferred embodiments of the present invention will be described with reference to the accompanying drawings.

FIGS. 3A through 3E are cross-sectional views showing a thin film transistor manufacturing method in one embodiment according to the present invention in the order of steps. In this embodiment, description will be given to a case of manufacturing a self aligned thin film transistor including a relatively thick gate insulating film and an LDD structure (lightly doped drain structure).

Figure 1A:
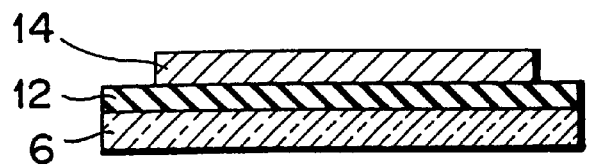
FIGS. 1A through 1D are sectional views showing a conventional thin film transistor manufacturing method.
Figure 1B:
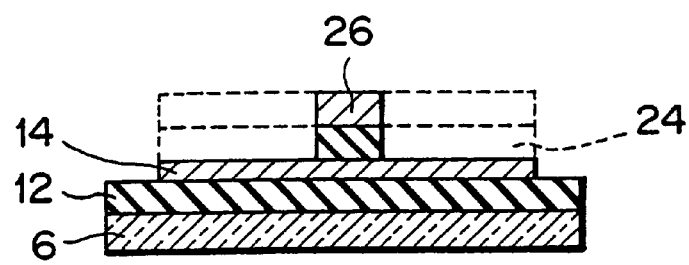
Figure 1C:
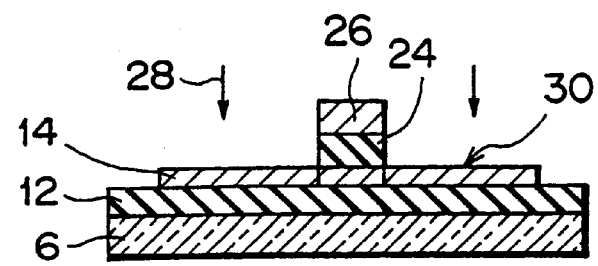
Figure 1D:
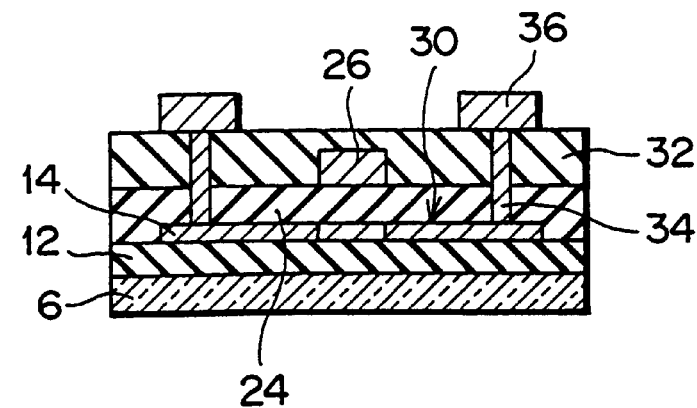
Figure 2A:
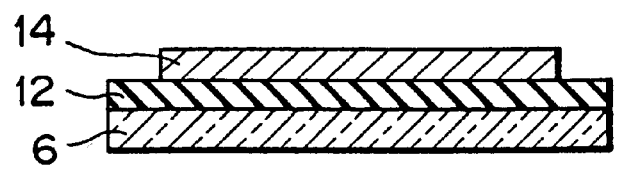
FIGS. 2A through 2D are sectional views showing another conventional thin film transistor manufacturing method.
Figure 2B:
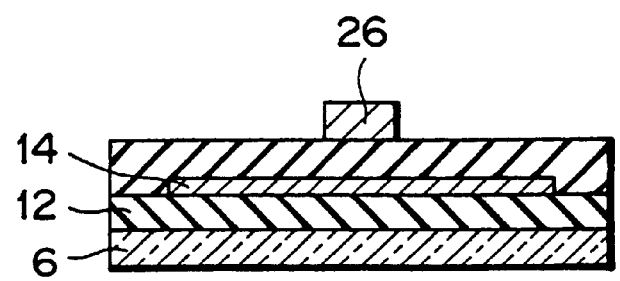
Figure 2C:
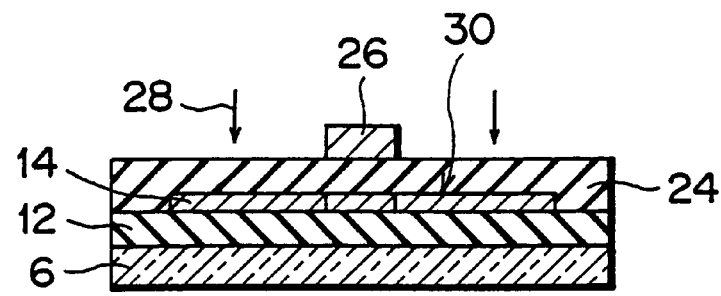
Figure 2D:
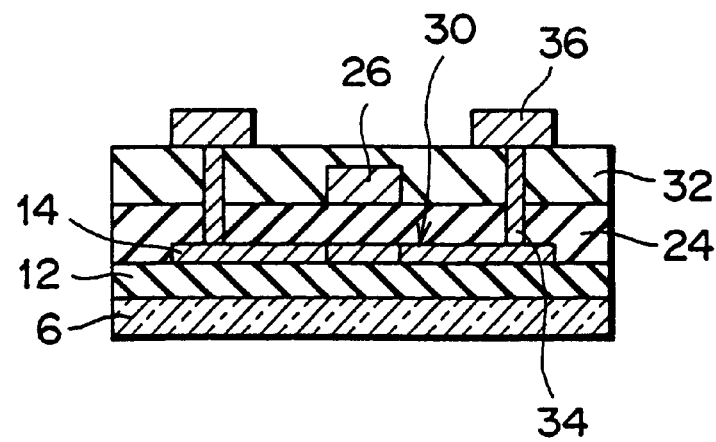
Figure 3A:
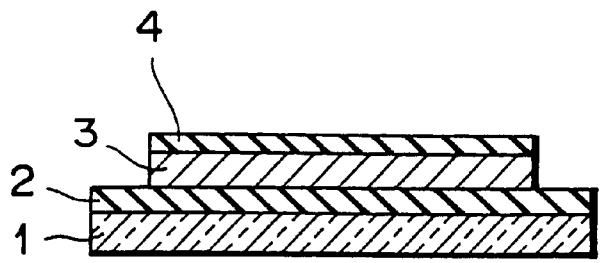
FIGS. 3A through 3E are cross-sectional views showing a thin film transistor manufacturing method in the first embodiment according to the present invention in the order or steps.

First, as shown in FIG. 3A, a silicon oxide film 2 as an insulating film is deposited on a glass substrate 1 to prevent heavy metal from diffusing prom the glass substrate 1 and precipitating thereon. Next, a polycrystalline silicon film 3 (thin film semiconductor layer) is formed on the silicon oxide film 2. The polycrystalline silicon film 3 can be formed by a laser application method, a low pressure chemical vapor deposition (LPCVD) method, a plasma chemical vapor deposition (PCVD) method or the like.

Next, a first gate insulating film 4 is formed on the polycrystalline silicon film 3, and the first gate insulating film 4 and the polycrystalline silicon film 3 are patterned into the same shape.

Figure 3B:
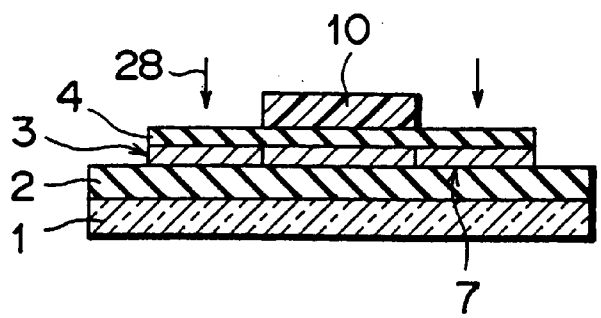

As shown in FIG. 3B, a resist film 10 is formed on the first gate insulating film 4. Using the resist film 10 as a mask, N-type impurities 28 (such as phosphorus) are doped into part of the polycrystalline silicon film 3 through the first insulating film 4 and the first source-drain region 7 is thereby formed.

Figure 3C:
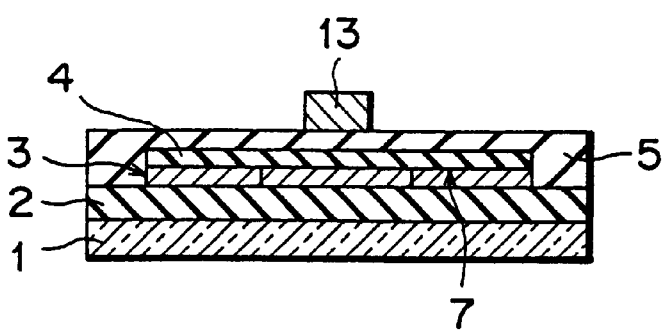

Then, as shown in FIG. 3C, while-the first gate insulating film 4 is being left, a silicon oxide film is further deposited on the first gate insulating film 4 to form a second gate insulating film 5. At this time, the film thickness of the first gate insulating film 4 and that of the second gate insulating film 5 are adjusted to have a desired gate insulating film thickness as a whole. Good transistor performance can be obtained by adjusting the first and second gate insulating films 4 and 5 to have a thickness of, for example, about 800 to 1000 Å as a whole.

The resist film 10 is set to have a slightly larger area than that of a gate electrode 13 to be formed later so as to dope impurities into an area excluding a region including the gate electrode 13 inside (i.e., a region of the resist film 10).

Next, a doped polycrystalline silicon film or silicide film is formed on the second gate insulating film 5 and patterned to thereby form a gate electrode 13. At this time, only the gate electrode 13 is etched while the first and second gate insulating films 4 and 5 are left unetched as in the case of the conventional method. It is relatively easy to selectively etch the doped polycrystalline silicon film or silicide film on the silicon oxide film (second gate insulating film 5). Thus, there is no fear of decreasing production yield as a result of this etching process.

Figure 3D:
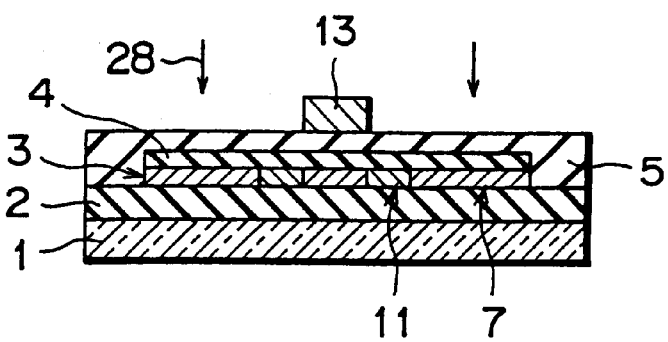

Then, as shown in FIG. 3D, using the gate electrode 13 as a mask, N-type impurities 28 are doped into the polycrystalline silicon film 3, thereby forming the second source-drain region 11 which is lightly doped compared with the first source-drain region 7 in the polycrystalline silicon film 3 around the gate electrode The impurities 28 are doped through the first and second gate insulating films 4 and 5 having a thickness of about 800 to 1000 Å. When doping is performed using, in particular, N-type dopant of phosphorus, through such thick insulating films, not only doping efficiency is lowered but also the insulating films are damaged because of high energy ions needed for doping. In this embodiment, however, light impurity doping is performed. Owing to this, the reduction of doping efficiency is not an important problem. In addition, since there is no need to implant the impurities 28 at high speed, electrostatic damage do not occur to the first and second gate insulating films 4 and 5.

Figure 3E:
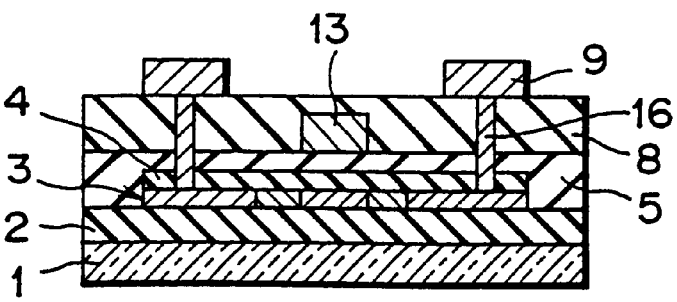
Figure 4A:
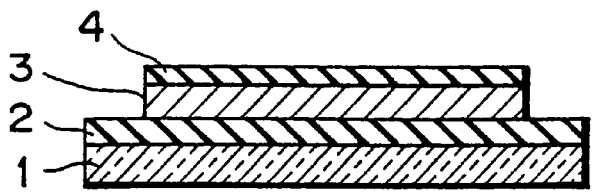
FIGS. 4A through 4E are cross-sectional views showing a thin film transistor manufacturing method in the second embodiment according to the present invention in the order of steps.
Figure 4B:
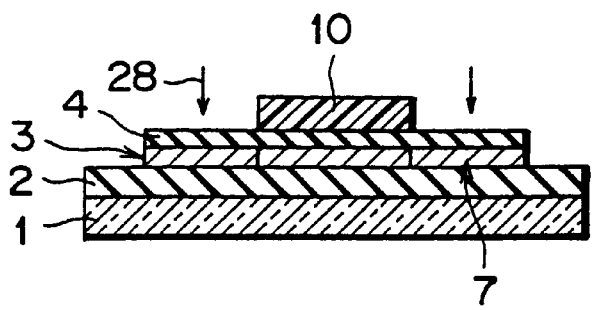
Figure 4C:
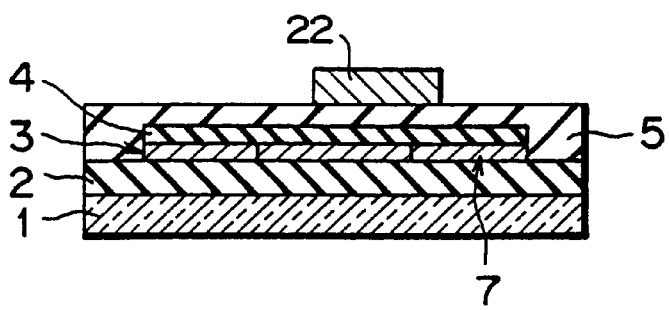
Figure 4D:
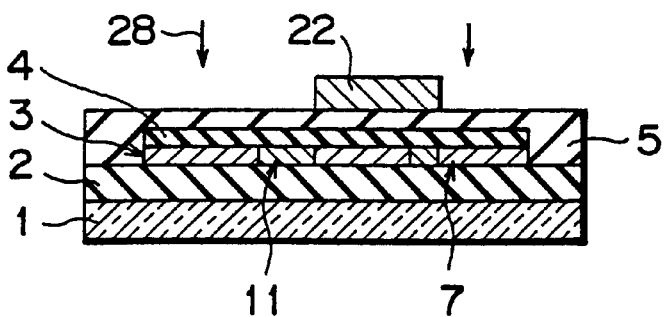
Figure 4E:
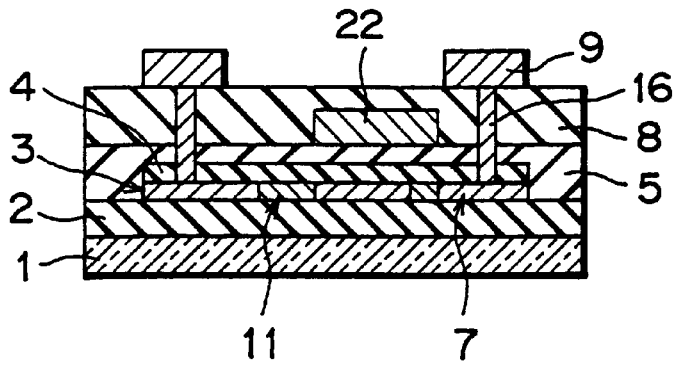

Next, the doped impurities 28 are activated and then, as shown in FIG. 3E, an interlayer insulating film 8 is formed on the second gate insulating film 5 and the gate electrode 13. A contact hole 16 is formed to pass through the interlayer insulating film 8 and the first and second gate insulating films 4 and 5 and connect to the polycrystalline silicon film 3. An electrode 9 connected to the contact hole 16 is formed on the interlayer insulating film 8. Thus, a thin film transistor is completed.

As described above, in the thin film transistor manufacturing method in this embodiment, it is enough for the first and second gate insulating films 4 and 5 to have a necessary thickness for the gate insulating film 24 as a whole and, therefore, the first insulating film 4 may be formed thinly. Due to this, if the impurities 28 are doped through the first gate insulating film 4, necessary impurity concentration can be obtained without implanting the impurities 28 at high speed. Also, In case of the second doping conducted through the first and second gate insulating films 4 and 5, the impurities 28 are doped relatively lightly. In this case, too, there is no need to implant the impurities 28 at high speed. Therefore, electrostatic damage does not occur to the first and second gate insulating films 4 and 5.

Before the second doping, the gate electrode 13 is formed by etching process. Since the second gate insulating film 5 is formed out of a semiconductor oxide film and the gate electrode 13 is formed of doped polycrystalline silicon or silicide, the gate electrode 13 of doped polycrystalline silicon or silicide formed on the semiconductor oxide film can be etched relatively easily. Thus, etching can be always performed in a stable manner and there is no fear of the reduction of production yield resulting from this etching process.

Next, the second embodiment of the present invention will be described. FIGS. 4A through 4E are cross-sectional views showing a thin film transistor manufacturing method in this embodiment in the order of steps. The same elements are denoted by the same reference numerals as those in FIGS. 3A through 3E and no detailed description will be given thereto.

The thin film transistor manufacturing method in the second embodiment differs from that in the first embodiment in that a gate electrode 22 is formed to partly face the first source-drain region 7 with the first and second gate insulating Films 4 and 5 put between them. Thus, in this embodiment, the main parts of the gate electrode 22 are formed inside the region of a resist mask 10, while part of the gate electrode 22 is extended outside of the region of the resist mask 10 The gate electrode 22 is formed in this manner, so that a capacitor can be formed in a position in which the gate electrode 22 faces the first source-drain region 7.

Owing to this, the second embodiment has an advantage that the above-stated capacitor can be formed quite easily in addition to the same advantage as that of the first embodiment. Therefore, when a capacitor connected between the gate and, for example, a source is needed for a circuit, there is no need to form the capacitor independently of the thin film transistor. In this respect, the second embodiment is very useful for seeking cost reduction and downsizing.

It is noted that impurities are doped after forming the gate electrode in the conventional manufacturing method shown in FIGS. 1A through 1D. Due to this, a conductor cannot be formed below the gate electrode 13 and a capacitor cannot be formed by putting the gate insulating film 24 between the gate electrode 13 and the source-drain region 30. Although it is possible to form a conductor by doping impurities into part of the portion which is to positioned below the gate electrode 13 in advance, a doping step needs to be added, thereby increasing cost.

Now, the third embodiment of the present invention will be described.

FIGS. 5A through 5H are cross-sectional views showing a thin film transistor manufacturing method in the third embodiment according to the present invention in the order of steps. The same elements are denoted by the same reference numerals as those in FIGS. 3A through 3E. By way of example, the manufacture of a CMOS polycrystalline silicon thin film transistor which constitutes an array substrate far a liquid crystal display device will be described in this embodiment. As described later, the N-type thin film transistor and the P-type thin film transistor are formed adjacent each other on a single substrate.

Figures 5A, 5B, 5C, 5D, 5E:
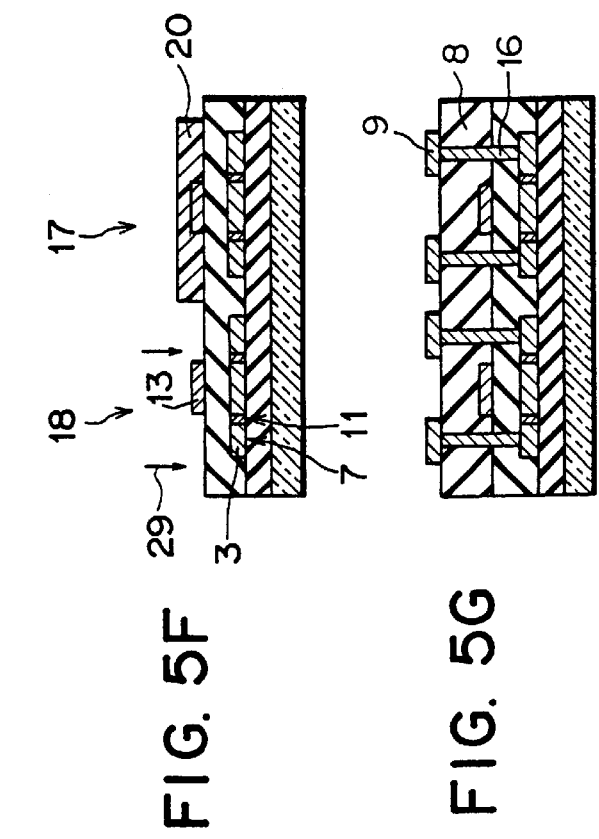
FIGS. 5A through 5H are cross-sectional views showing a thin film transistor manufacturing method in the third embodiment according to the present invention in the order of steps.

First, as shown in FIG. 5A, a silicon oxide film 2 as an insulating film is deposited on a glass substrate 1 to prevent heavy metal from diffusing from the glass substrate 1 and precipitating thereon, as in the case of the preceding embodiments. Then, a polycrystalline silicon film 3 (thin film semiconductor layer of the present invention) is formed on the silicon oxide film 2. The polycrystalline silicon film 3 can be formed by a laser application method, a low pressure chemical vapor deposition (LPCVD) method, a plasma chemical vapor deposition (PCVD) method or the like Next, the first gate insulating film 4 is formed on the polycrystalline silicon film 3, and the first gate insulating film 4 and the polycrystalline silicon film 3 are patterned into the same shape in both the first transistor region 17 and the second transistor region 18.

As shown in FIG. 5B, the second transistor region 18 is covered with a resist film 19 and a resist film 10 is provided on part of the region of the gate insulating film 4 in the first transistor region 17. In the first transistor region 17, using the resist film 10 as a mask, N-type impurities 28 (such as phosphorus) are doped into part of the polycrystalline silicon film 3 through the first gate insulating film 4, thereby forming the first source-drain region 7.

Thereafter, as shown in FIG. 5C, the resist film 19 in the second transistor region 18 is removed. This time, while covering the first transistor region 17 with the resist film 19, P-type impurities 29 (such as boron) are doped into part of the polycrystalline silicon film 3 in the second transistor region 18 through the first gate insulating film 4 using the resist film 10 to thereby form the first source-drain region 7.

As shown in FIG. 5D, the first gate insulating film 4 is left, a silicon oxide film is further deposited on the first gate insulating film 4 in the first and second transistor regions 17 and 18. At this time, the film thicknesses of the first gate insulating film 4 and that of the second insulating film 5 are adjusted to have a desired gate insulating film thickness as a whole. Good transistor performance can De obtained by adjusting the overall thickness of the first and second gate insulating films 4 and 5 to, for example, about 800 to 1000 Å.

The resist mask la is set to have a slightly larger area than that of a gate electrode 13 to be formed later so that the above-stated doping is performed except for a region including the gate electrode 13 inside (i.e., a region of the resist mask 10).

Next, in each of the first and second transistor regions 17 and 18, a doped polycrystalline silicon film or silicide film is formed on the second gate insulating film 5 and patterned to form a gate electrode 13. At this time, only the gate electrode 13 is etched while the first and second gate insulating films 4 and 5 are left unetched as in the case of the conventional method. The selective etching of the doped polycrystalline silicon film or silicide film on the silicon oxide film (second gate insulating film 5) is relatively easy to perform. Thus, there is no fear of decreasing production yield resulting from this etching process.

Thereafter, as shown in FIG. 5E, the second transistor region 18 is covered with a resist mask 20 and N-type impurities 28 are doped into the first transistor region 17 using the gate electrode 13 as a mask. Thus, the second source-drain region 11 which is doped lightly compared with the first source-drain region 7 is formed in the polycrystalline silicon film 3 around the gate electrode 13.

Figures 5F, 5G, 5H:
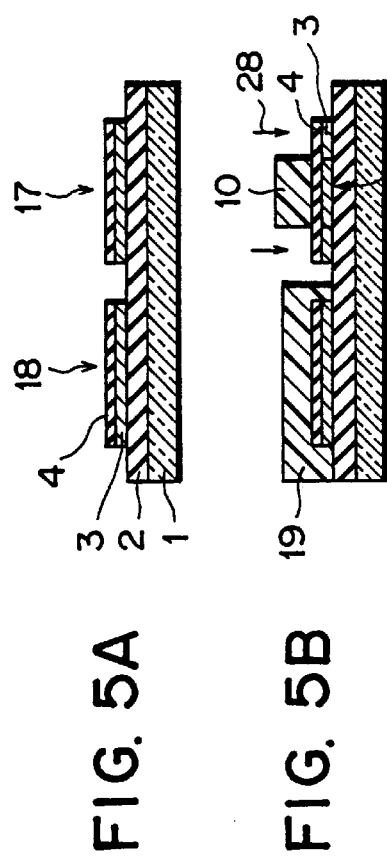

Next, as shown in FIG. 5F, the resist mask 20 in the second transistor region 18 is removed and the first transistor region 17 is covered with the resist mask 20. P-type impurities 29 are doped into the second transistor region 18 using the gate electrode 13 as a mask. Thus, the second source-drain region 11 which is doped lightly compared with the first source-drain region 7 is formed in the polycrystalline silicon film 3 around the gate electrode 13.

The impurities 28 and 29 are doped through the first and second gate insulating films 4 and 5 having a thickness of about 800 to 1000 Å as a whole. When doping is performed using, in particular, N-type dopant of phosphorus through such thick insulating films, not only doping efficiency is lowered but also the insulating films are damaged because of high energy ions needed for doping. In this embodiment, however, light impurity doping is performed. Owing to this, the reduction of doping efficiency is not an important problem. In addition, since there is no need to implant the impurities 28 and 29 at high speed, electrostatic damage does not occur to the first and second gate insulating films 4 and 5.

Next, the doped impurities 28 are activated and then, as shown in FIG. 5G, an interlayer insulating film 8 is formed on the second gate insulating film 5 and the gate electrode 13. A contact hole 16 is formed to pass through the interlayer insulating film 8 and the first and second gate insulating films 4 and 5 and connect to the polycrystalline silicon film 3. An electrode 9 connected to the contact hole 16 is formed on the interlayer insulating film 8. Thus, N-type and P-type thin film transistors are completed. Furthermore, in this embodiment, an insulating film 21 is formed on the interlayer insulating film 8 and the electrode 9 and a transparent electrode 23 consisting of ITO (Indium Tin Oxide) and connected to the electrode 9 is formed. Thus, an array substrate for a liquid crystal display device is completed.

As can be seen from the above, in the third embodiment, when the impurities 28 are doped through the first gate insulating film 4, necessary impurity concentration can be obtained without implanting the impurities 28 at high speed. Also, in case of the second doping conducted through the first and second gate insulating films 4 and 5, the impurities 28 are doped relatively lightly. In this case, too, there is no need to implant the impurities 28 at high speed. Electrostatic damage does not, therefore, occur to the first and second gate insulating films 4 and 5.

Before the second doping, the gate electrode 13 is formed by etching process. Since the second gate insulating film 5 is formed of a semiconductor oxide film and the gate electrode 13 is formed of doped polycrystalline silicon or silicide in the third embodiment as in the case of the preceding embodiments, the gate electrode 13 of doped polycrystalline silicon or silicide formed on the semiconductor oxide film can be etched relatively easily. Thus, etching can be always performed in a stable manner and there is no fear or the reduction of production yield resulting from this etching process.

Now, the fourth embodiment according to the present invention will be described. FIGS. 6A through 6G are cross-sectional views showing a thin film transistor manufacturing method in the fourth embodiment in the order of steps. In FIGS. 6A through 6G, the same elements are denoted by the same reference numerals as those in FIGS. 5A through 5H. In this embodiment, like the third embodiment, the manufacture of a CMOS polycrystalline silicon thin film transistor which constitutes an array substrate for a liquid crystal display device will be described by way of example. The N-type thin film transistor is manufactured in the same steps as in the third embodiment. The P-type thin film transistor is manufactured in simpler steps, in which respect, the fourth embodiment differs from the third embodiment.

That is to say, in the fourth embodiment, boron as P-type impurities 29 is not doped through the first gate insulating film 4. Instead, soon after impurities are doped in the first transistor region 17 shown in FIG. 6B, a gate electrode 13 is formed as shown in FIG. 6C. Thereafter, as shown in FIG. 6E, P-type impurities 29 are doped through the first and second gate insulating films 4 and 5.

Boron as P-type impurities 29 has a small mass. For that reason, the impurities 29 of necessary concentration can be doped without implanting them at high speed when doped through the first and second gate insulating films 4 and 5. There is no need to accelerate the impurities 29 by applying high voltage and no electrostatic damage occurs to the first and second gate insulating films 4 and 5.

The fourth embodiment has an advantage of realizing the reduction of the number of steps and, therefore, the reduction of cost in addition to the same advantage as that of the third embodiment.

It is noted that, in this embodiment, a capacitor can be easily formed between the gate electrode 13 and the first source-drain region 7 by forming the gate electrode 13 in the first transistor region 17 in the same manner as in the third embodiment.

As stated so far, according to the present invention, it is enough for the thickness of the first and second gate insulating films to have a necessary gate insulating film thickness as a whole and the first gate insulating film may be formed thinly. Due to this, when impurities are doped through the first gate insulating film, necessary impurity concentration can be obtained without implanting the impurities at high speed. Also, in case of the second doping conducted through the first and second gate insulating films, the impurities are doped relatively lightly. In this case, too, there is no need to implant the impurities at high speed. Electrostatic damage does not, therefore, occur to the first and second gate insulating films, resulting in an increase in production field.

Before the second doping, the gate electrode is formed by etching process. Since the second gate insulating film is formed of, for example, a semiconductor oxide film and the gate electrode is formed of doped polycrystalline silicon or silicide, the gate electrode of doped polycrystalline silicon or silicide formed on the semiconductor oxide film can be etched relatively easily. Thus, etching can be always performed in a stable manner and there is no fear of the reduction of production yield resulting from this etching process.

In the thin film transistor manufacturing method in the present invention for forming an N-type thin film transistor and a P-type thin film transistor on the same single insulating substrate, the N-type transistor is formed basically in the same steps as in the preceding embodiment. Therefore, the present invention has the same advantage as that of the preceding invention. As for the P-type transistor, P-type impurities are doped through the first and second gate insulating films using the gate electrode as a mask In this case, too, the insulating layer is not etched unlike the conventional method and the problem relating to etching process does not occur. Further, since doping is performed only once, it is possible to manufacture a thin film transistor with less steps.

Furthermore, by using P-type impurities such as boron which have a small mass, the impurities of necessary concentration can be doped without implanting them at high speed in case of doping conducted through the first and second gate insulating films. Owing to this, there is no need to accelerate impurities by applying high voltage and no electrostatic damage occurs to the first and second gate insulating films.

What is claimed is:

1. A method of manufacturing a thin film transistor including a thin film semiconductor layer on an insulating substrate, a source-drain region formed in said thin film semiconductor layer, a gate electrode above the region between said source region and drain region and an electrode connected to said source-drain region, said method comprising the steps of:

after forming said thin film semiconductor layer on said insulating substrate, forming a first gate insulating film on said thin film semiconductor layer to cover said thin film semiconductor layer;

patterning said thin film semiconductor layer and said first gate insulating film into an island shape, doping impurities into said thin film semiconductor layer through said first gate insulating film excluding a region including at least main parts of said gate electrode through said first gate insulating film and forming said first source-drain region in part of said thin film semiconductor layer;

forming a second gate insulating film on said first gate insulating film to cover said first gate insulating film;

forming said gate electrode on said second gate insulating film; and doping impurities lightly concentrated as compared with said first source-drain region through said first and second gate insulating films using said gate electrode as a mask, and thereby forming a second source-drain region in said thin film semiconductor layer.

2. A method of manufacturing a thin film transistor according to claim 1, wherein said first source-drain region is formed in part of said thin film semiconductor layer by forming a resist mask in part or a region on said first gate insulating film to block first impurities.

3. A method of manufacturing a thin film transistor according to claim 1, wherein said impurities are one of N-type impurities and P-type impurities.

4. A method of manufacturing a thin film transistor according to claim 1, wherein said gate electrode is formed to partly face said first source-drain region with said first and second gate insulating films therebetween.

5. A method of manufacturing a thin film transistors having an N-type thin film transistor and a P-type thin film transistor on a same single insulating substrate, each of said N-type thin film transistor and send P-type thin film transistor including a thin film semiconductor layer on said insulating substrate, a source-drain region in said thin film semiconductor layer, a gate electrode above the region between said source region and drain region and an electrode connected to said source-drain region, wherein said method comprises the steps of:

after forming said thin film semiconductor layer on said insulating substrate, forming a first gate insulating film on said thin film semiconductor layer to cover said thin film semiconductor layer;

patterning said thin film semiconductor layer and said first gate insulating film into an island shape and forming at least first and second transistor regions;

doping N-type impurities into said thin film semiconductor layer in said first transistor region excluding a region including at least main parts of said gate electrode through said first gate insulating film and forming a first N type source-drain region in part of said thin film semiconductor layer;

forming a second gate insulating film on said first gate insulating film to cover said first gate insulating film;

forming said gate electrode on said second gate insulating film in each of said first and second transistor regions;

forming a second N-type source-drain region in said thin film semiconductor layer in said first transistor region by doping N-type impurities lightly concentrated as compared with said first source-drain region through said first and second gate insulating film using said gate electrode as a mask; and forming a P-type source-drain region in said thin film semiconductor layer in said second transistor region by doping P-type impurities through said first and second gate insulating films using said gate electrode as a mask.

6. A method of manufacturing a thin film transistor according to claim 5, wherein said first N-type source-drain region is formed in part of said thin film semiconductor layer by forming a resist mask in part of a region on said first gate insulating film to block said N-type impurities.

7. A method of manufacturing a thin film transistor according to claim 5, wherein said N-type and P-type thin film transistors constitute a CMOS circuit.

8. A method of manufacturing a thin film transistor according to claim 5, wherein said gate electrode in said first transistor region is formed to partly face said first N-type source-drain region with said first and second gate insulating films therebetween.

9. A method of manufacturing a thin film transistor according to claim 1, wherein said insulating substrate is a transparent substrate.

10. A method of manufacturing a thin film transistor according to claim 9, wherein said insulating substrate is a glass substrate.

11. A method of manufacturing a thin film transistor according to claim 1, wherein a silicon oxide film is interposed between said insulating substrate and said thin film semiconductor layer.

12. A method of manufacturing a thin film transistor according to claim 1, wherein said thin film semiconductor layer formed of a polycrystalline silicon film.

13. A method of manufacturing a thin film transistor according to claim 1, wherein said thin film semiconductor layer is formed by one of a laser application method, a chemical vapor deposition method and a plasma chemical vapor deposition method.

14. A method of manufacturing a thin film transistor according to claim 1, wherein said gate electrode is formed by forming one of a doped polycrystalline silicon film and a silicide film on said second gate insulating film and, thereafter, selectively etching the polycrystalline silicon film or silicide film.

15. A method of manufacturing a thin film transistor according to claim 5, wherein said insulating substrate is a transparent substrate.

16. A method of manufacturing a thin film transistor according to claim 5, wherein a silicon oxide film is interposed between said insulating substrate and said thin film semiconductor layer.

17. A method of manufacturing a thin film transistor according to claim 5, wherein said thin film semiconductor layer formed of a polycrystalline silicon film.

18. A method of manufacturing a thin film transistor according to claim 5, wherein said thin film semiconductor layer is formed by one of a laser application method, a chemical vapor deposition method and a plasma chemical vapor deposition method.

19. A method of manufacturing a thin film transistor according to claim 5, wherein said gate electrode is formed by forming one of a doped polycrystalline silicon film and a silicide film on said second gate insulating film and, thereafter, selectively etching the polycrystalline silicon film or silicide film.

* * * * *